(12) United States Patent
Yan et al.

(10) Patent No.: US 10,219,345 B2
(45) Date of Patent: Feb. 26, 2019

(54) TUNABLE LED EMITTER WITH CONTINUOUS SPECTRUM

(71) Applicant: LedEngin, Inc., San Jose, CA (US)

(72) Inventors: Xiantao Yan, Palo Alto, CA (US); Kachun Lee, Fremont, CA (US); Shifan Cheng, Milpitas, CA (US); Julio Cesar Alvarado, East Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 15/348,940

(22) Filed: Nov. 10, 2016

(65) Prior Publication Data

US 2018/0132329 A1 May 10, 2018

(51) Int. Cl.
| | |
|---|---|
| *H05B 33/08* | (2006.01) |
| *H01L 25/075* | (2006.01) |
| *H01L 33/48* | (2010.01) |
| *H01L 33/54* | (2010.01) |
| *H01L 33/56* | (2010.01) |

(Continued)

(52) U.S. Cl.
CPC ..... *H05B 33/0857* (2013.01); *H01L 25/0753* (2013.01); *H01L 33/483* (2013.01); *H01L 33/54* (2013.01); *H01L 33/56* (2013.01); *H01L 33/58* (2013.01); *H01L 33/62* (2013.01); *H05B 33/086* (2013.01); *H05B 33/0827* (2013.01); *H05B 33/0845* (2013.01)

(58) Field of Classification Search
CPC ....... H01L 33/504; H01L 33/58; H01L 33/56; H01L 25/0753; H01L 33/483; H01L 33/54; H01L 33/62; H05B 33/0857; H05B 33/0827; H05B 33/0845

USPC .................................................. 315/291–297
See application file for complete search history.

(56) References Cited

U.S. PATENT DOCUMENTS

| | | |
|---|---|---|
| 5,742,120 A | 4/1998 | Lin |
| 5,959,316 A | 9/1999 | Lowery |
| 6,016,038 A | 1/2000 | Mueller |

(Continued)

FOREIGN PATENT DOCUMENTS

| | | |
|---|---|---|
| EP | 1234140 | 8/2002 |
| EP | 1610593 | 12/2005 |

(Continued)

OTHER PUBLICATIONS

Megumi Yoshizawa, "Japanese Institute Prototypes White LED Composed of RGB Primary Colors," Nikkei Electronics, Mar. 25, 2008, p. 1.

(Continued)

*Primary Examiner* — Douglas W Owens
*Assistant Examiner* — Amy X Yang
(74) *Attorney, Agent, or Firm* — Kilpatrick Townsend & Stockton LLP

(57) ABSTRACT

A light emitting device can include a substrate with LED chips disposed on a surface of the substrate. The LED chips can include chips of at least four different colors. Electrical paths disposed in part on the substrate and in part within the substrate can connect the LED chips into at least three independently addressable groups, and the number of independently addressable groups can be less than the number of colors of LED chips, so that at least one of the groups includes LED chips of two or more different colors.

23 Claims, 21 Drawing Sheets

(51) Int. Cl.
*H01L 33/58* (2010.01)
*H01L 33/62* (2010.01)

(56) References Cited

U.S. PATENT DOCUMENTS

| | | |
|---|---|---|
| 6,252,254 B1 | 6/2001 | Soules et al. |
| 6,307,160 B1 | 10/2001 | Mei et al. |
| 6,351,069 B1 | 2/2002 | Lowery et al. |
| 6,608,332 B2 | 8/2003 | Shimizu et al. |
| 6,614,179 B1 | 9/2003 | Shimizu et al. |
| 6,642,652 B2 | 11/2003 | Collins, III et al. |
| 6,680,128 B2 | 1/2004 | Mei |
| 6,791,116 B2 | 9/2004 | Takahashi et al. |
| 6,828,170 B2 | 12/2004 | Roberts et al. |
| 6,833,565 B2 | 12/2004 | Su et al. |
| 6,967,447 B2 | 11/2005 | Lim et al. |
| 7,045,375 B1 | 5/2006 | Wu et al. |
| 7,064,353 B2 | 6/2006 | Bhat |
| 7,066,623 B2 | 6/2006 | Lee et al. |
| 7,156,538 B2 | 1/2007 | Han et al. |
| 7,157,744 B2 | 1/2007 | Palmteer et al. |
| 7,168,608 B2 | 1/2007 | Mei |
| 7,199,446 B1 | 4/2007 | Mei et al. |
| 7,264,378 B2 | 9/2007 | Loh |
| 7,473,933 B2 | 1/2009 | Yan |
| 7,670,872 B2 | 3/2010 | Yan |
| 7,772,609 B2 | 8/2010 | Yan |
| 8,529,791 B2 | 9/2013 | Wu |
| 8,598,809 B2 | 12/2013 | Negley et al. |
| 9,528,665 B2 | 12/2016 | Mei |
| 9,530,943 B2 | 12/2016 | Cheng |
| 2001/0015778 A1 | 8/2001 | Murade |
| 2001/0050371 A1 | 12/2001 | Odaki |
| 2002/0015013 A1 | 2/2002 | Ragle |
| 2002/0079837 A1 | 6/2002 | Okazaki |
| 2002/0163006 A1 | 11/2002 | Yoganandan et al. |
| 2002/0191885 A1 | 12/2002 | Wu et al. |
| 2003/0016899 A1 | 1/2003 | Yan |
| 2003/0086674 A1 | 5/2003 | Yan et al. |
| 2003/0095399 A1 | 5/2003 | Grenda et al. |
| 2003/0116769 A1 | 6/2003 | Song et al. |
| 2003/0122482 A1 | 7/2003 | Yamanaka et al. |
| 2003/0227249 A1 | 12/2003 | Mueller et al. |
| 2003/0230977 A1 | 12/2003 | Epstein |
| 2004/0004437 A1 | 1/2004 | Shimizu et al. |
| 2004/0051111 A1 | 3/2004 | Ota et al. |
| 2004/0079957 A1 | 4/2004 | Andrews et al. |
| 2004/0102061 A1 | 5/2004 | Watanabe |
| 2004/0126918 A1 | 7/2004 | Kurahashi et al. |
| 2004/0173810 A1 | 9/2004 | Lin et al. |
| 2004/0201025 A1 | 10/2004 | Barnett et al. |
| 2004/0218387 A1* | 11/2004 | Gerlach .............. F21K 9/00 362/231 |
| 2004/0257496 A1 | 12/2004 | Sonoda |
| 2005/0035364 A1 | 2/2005 | Sano et al. |
| 2005/0062140 A1 | 3/2005 | Leung et al. |
| 2005/0093146 A1 | 5/2005 | Sakano |
| 2005/0145872 A1 | 7/2005 | Fang et al. |
| 2005/0179376 A1 | 8/2005 | Fung et al. |
| 2005/0199900 A1 | 9/2005 | Lin et al. |
| 2005/0224830 A1 | 10/2005 | Blonder et al. |
| 2005/0253242 A1 | 11/2005 | Costello et al. |
| 2005/0270666 A1 | 12/2005 | Loh et al. |
| 2005/0286131 A1 | 12/2005 | Saxena et al. |
| 2006/0012299 A1 | 1/2006 | Suehiro et al. |
| 2006/0063287 A1 | 3/2006 | Andrews |
| 2006/0082296 A1 | 4/2006 | Chua et al. |
| 2006/0082679 A1 | 4/2006 | Chua et al. |
| 2006/0091788 A1 | 5/2006 | Yan |
| 2006/0097385 A1 | 5/2006 | Negley |
| 2006/0170332 A1 | 8/2006 | Tamaki et al. |
| 2006/0284209 A1 | 12/2006 | Kim et al. |
| 2007/0194341 A1 | 8/2007 | Chang et al. |
| 2007/0223219 A1 | 9/2007 | Medendorp et al. |
| 2007/0274098 A1 | 11/2007 | Wheatley et al. |
| 2007/0278512 A1 | 12/2007 | Loh et al. |
| 2008/0258602 A1 | 10/2008 | Masuda et al. |
| 2008/0308825 A1 | 12/2008 | Chakraborty et al. |
| 2009/0014741 A1 | 1/2009 | Masuda |
| 2009/0046453 A1 | 2/2009 | Kramer |
| 2010/0060185 A1 | 3/2010 | Van Duijneveldt |
| 2010/0065864 A1 | 3/2010 | Kessels et al. |
| 2010/0066255 A1* | 3/2010 | Roberts .............. H05B 33/0818 315/151 |
| 2010/0091499 A1 | 4/2010 | Jiang et al. |
| 2010/0155755 A1 | 6/2010 | Dong |
| 2010/0188022 A1 | 7/2010 | Gerlach et al. |
| 2010/0259930 A1 | 10/2010 | Van |
| 2010/0308712 A1 | 12/2010 | Liu |
| 2011/0102706 A1 | 5/2011 | Oshio |
| 2012/0286669 A1 | 11/2012 | Van |
| 2012/0286699 A1 | 11/2012 | Van |
| 2013/0049021 A1 | 2/2013 | Ibbetson et al. |
| 2013/0075769 A1 | 3/2013 | Van |
| 2013/0221873 A1 | 8/2013 | Weaver |
| 2014/0042470 A1 | 2/2014 | Hsu |
| 2014/0210368 A1 | 7/2014 | Lee |
| 2014/0300284 A1* | 10/2014 | Lee .............. H05B 33/086 315/186 |
| 2015/0034980 A1* | 2/2015 | Windisch .............. H01L 27/15 257/89 |
| 2015/0282270 A1* | 10/2015 | Loveridge .......... H05B 33/0845 315/224 |
| 2016/0007419 A1 | 1/2016 | Lee |

FOREIGN PATENT DOCUMENTS

| | | |
|---|---|---|
| JP | 2000-349346 | 12/2000 |
| JP | 2000-349347 | 12/2000 |
| JP | 2001-057445 | 2/2001 |
| JP | 2002-185046 | 6/2002 |
| JP | 2004-241704 | 8/2004 |
| JP | 2004-253404 | 9/2004 |
| KR | 102010092686 | 2/2012 |

OTHER PUBLICATIONS

Kading, O.W., "Thermal Conduction in Metallized Silicon-Dioxide Layers on Silicon," Applied Physics, Sep. 1994, vol. 65, No. 13, pp. 1629-1631.
"Solvent Soluble Polyimide with High Transparency and High Tg: HOP-400, 500," Hitachi Cable Review, Aug. 2003, No. 22, p. 78.
Yan, Xiantao, "Two Test Specimens for Determining the Interfacial Fracture Toughness in Flip-Chip Assemblies," Jun. 1998, Transactions of the ASME, vol. 120, pp. 150-155.
Yan, Xiantao, "Analysis Based Design Guidelines for Metal Runner and Passivation Layers in IC Packaging," DELPHI Automotive Systems, Analytical Engineering Conference, May 2000, pp. 1-4.
LZC-03MCOO Data Sheet Rev 5.2—Mar. 12, 2013) downloaded from URL <https://web.archive.org/web/20 140707084 758/http ://www .ledeng in.com/files/products/LZC/LZC-03MCOO. pdf> on Feb. 4, 2016.
Joos, et al. Journal of Solid State Lighting 2014, 1 :6 pp. 2-16.
Wood, M., "CRI and the Color Quality Scale, Part 2", Out of the Wood, Spring 2010 downloaded from URL<http://www.ianiro.com/ media/formato2/ianiro.sub.--515.pdf> on Feb. 4, 2016.
Xie, Rong-Jun; Hirosaki, Naoto; Li, Vuanqiang; Takeda, Takashi. 2010. "Rare-Earth Activated Nitride Phosphors: Synthesis, Luminescence and Applications." Materials 3, No. 6: 3777-3793.
XR6436-03 Data Sheet downloaded from URL<http://www.intematix. com/uploads/phosphor-datasheets/nitrides/XR64- 36-03.pdf> on Feb. 4, 2016.
G1758 Data Sheet downloaded from URL<http://www.intematix. com/uploads/phosphor-datasheets/Silicate/G175- 8.pdf> on Feb. 4, 2016.
Bailey, S, "Why the LED R9 value isn't important" Mar. 28, 2013, downloaded from URL<http://www.leapfroglighting.com/whythe-led-r9-value-isnt-important- !> on Feb. 4, 2016.
Near, A., "Seeing Beyond CRI", LED Testing and Application, 2011, downloaded from URL<http://www.ies.org/Ida/HotTopics/ LED/4.pdf> on Feb. 4, 2016.

(56) References Cited

OTHER PUBLICATIONS

Consideratios for Blending LED Phosphors, Applications Note, downloaded from URL<http://www.intematix.com/uploads/application%20notes/Phosphor-BiendingAppNote1 0Jan2013.pdf> on Feb. 4, 2016.

Gallery White. Sep. 20, 2013, downloaded from URL<https://web.archive.org/web/20130920230548/http://www.ledengin.com-/products/gallerywhite> on Feb. 4, 2016.

Intermatix Patents Red Nitride Phosphor for LED Lighting, EETimes, Dec. 18, 2013 downloaded from X U R L <http:/ /led l ig hti ng -eeti mes .co m/e n/i ntem atix-patents-red-n itride-p hosp ho r-for -ledlighting.html?cmp.sub.--id=7&news.sub.--id=222908963> on Feb. 4, 2016.

\* cited by examiner

|  | Blue | Cyan | pcG | pcA | Red |
|---|---|---|---|---|---|
| Peak λ (nm) | 458.23 | 499.24 | 556.04 | 618.59 | 624.33 |
| CCT (K) | 0 | 12495 | 3661 | 1573 | 0 |
| Planck dist. | 0 | 0.150 | 0.042 | 0.0035 | 0 |
| CRI | 0 | -15.6 | 51.2 | 0 | 0 |
| R9 | 0 | -245.2 | -78.2 | 0 | 0 |
| lm/W | 25 | 39 | 112 | 45 | 81 |

*1000*

|  | 2200 K | 3000 K | 6500 K |
|---|---|---|---|
| TM30 Rf | 89 | 89 | 86 |
| TM30 Rg | 103 | 100 | 97 |
| Duv | 0.0002 | -0.0002 | 0.0004 |
| CIE x | 0.5087 | 0.4369 | 0.3132 |
| CIE y | 0.4157 | 0.4037 | 0.3241 |
| CIE $R_a$ | 94 | 93 | 92 |
| CRI | 93.5 | 93.4 | 91.5 |
| CRI09-CRI | 52.3 | 60.3 | 55.3 |
| lm | 509 | 567 | 537 |
| Power (W) | 9.6 | 10.08 | 11.28 |
| lm/W | 53.03 | 56.27 | 47.56 |

*FIG. 10*

TUNABLE LED EMITTER WITH CONTINUOUS SPECTRUM

BACKGROUND

This disclosure relates generally to light-emitting devices and in particular to an LED emitter that produces light having a continuous spectrum.

Light sources based on light-emitting diodes (LEDs) are emerging as an energy-efficient replacement for conventional incandescent or halogen light sources in a variety of applications. Compared to conventional light sources, LED-based light sources can provide significantly higher energy efficiency and longer life.

However, a number of challenges must be addressed to provide practical LED-based light sources. For example, a given LED emits light in a narrow band of wavelengths, which creates challenges for the production of white light (which is generally a mixture of different wavelengths). Further, not all white light is created equal. The human eye is sensitive to the differences among white-light sources such as fluorescent light, incandescent light, and sunlight. "Color temperature" generally refers to the spectrum of light produced by a black body radiator at a given temperature, and artificial light sources can be assigned a correlated color temperature (CCT) based on approximate color-matching to a blackbody radiator. Moreover, not all white light of a given CCT is equivalent. For instance, in the case of environmental lighting, the quality of light depends on its spectral content, which determines how objects of various colors will appear when illuminated by the light. Quality of color may be measured using various metrics, such as the widely used color rendering index (CRI, or "CIE $R_a$"), as defined by the International Commission on Illumination (CIE). CIE $R_a$ is a quantitative measure of how accurately an artificial light source reproduces object color across a range of colors, as compared with natural light. The artificial light source can be tested using a number of CIE standard color samples; examples used herein are based on the standard R1-R15 sample set. Another measure of quality of color includes the "TM-30-15" color metrics recently published by the Illuminating Engineering Society (IES) (Technical Memorandum TM-30-15, entitled "IES Method for Evaluating Light Source Color Rendition"). TM-30-15 color metrics include a fidelity metric (Rf) similar to CRI and a gamut metric (Rg) that indicates average saturation level relative to a reference source. High CRI, or Rf and Rg close to 100, are desirable characteristics for a quality white light source.

SUMMARY

In terms of color quality, typical LED-based light sources suffer in comparison to incandescent and halogen light. The narrow-band emissions of LEDs tend to create a stark light with low color quality, even when multiple different colored LEDs are used in combination.

Certain embodiments of the present invention relate to LED emitter packages and lighting devices incorporating LED emitter packages that may provide high-quality environmental lighting by incorporating LEDs of at least five colors and by controlling the relative intensity of different groups of LEDs using a number of driver channels that is less than the number of LED colors. In some embodiments, the light can be tunable across a range of the blackbody locus (e.g., CCT from about 1900 K to about 6500 K or from about 2200 K to about 6500 K).

In some embodiments, a light emitting device can include a substrate with LED chips disposed on a surface of the substrate (e.g., within a recess). The LED chips can include chips of at least four different colors (e.g., five colors or more). Electrical paths disposed in part on the substrate and in part within the substrate can connect the LED chips into at least three independently addressable groups. In some embodiments, the number of independently addressable groups can be less than the number of colors of LED chips, so that at least one of the groups includes LED chips of two or more different colors. For example, a first one of the LED groups can include a blue LED chip and a cyan LED chip, while a second one of the LED groups includes a red LED chip and an amber LED chip and a third one of the groups includes one or more green LED chips that produce broad-spectrum light dominated by green wavelengths. In other embodiments, a first one of the LED groups can include one or more cyan LED chips, while a second one of the LED groups includes a red LED chip and an amber LED chip and a third one of the groups includes one or more green LED chips that produce broad-spectrum light dominated by green wavelengths. In still other embodiments, a first one of the LED groups can include a bluish white LED chip and a cyan LED chip, while a second one of the LED groups includes a red LED chip and an amber LED chip and a third one of the groups includes one or more green LED chips that produce broad-spectrum light dominated by green wavelengths. Still other combinations are also possible, and in some embodiments, the number of control channels can be equal to the number of colors of LED chips.

In some embodiments, each of the groups of LEDs can be electrically connected to a different channel of a control and driver circuit. The control and driver circuit can generate an operating current on each channel and can adjust the relative operating currents to adjust the color of the output light based on an input control signal, which can be, e.g., a signal indicating a desired CCT for the output light.

The following detailed description, together with the accompanying drawings, will provide a further understanding of the nature and advantages of the claimed invention.

BRIEF DESCRIPTION OF THE DRAWINGS

FIG. 10 shows a table summarizing color quality measurement for a test source according to an embodiment of the present invention at different CCT.

DETAILED DESCRIPTION

Certain embodiments of the present invention relate to LED emitter packages and lighting devices incorporating LED emitter packages that may provide high-quality environmental lighting by incorporating LEDs of at least five colors and by controlling the relative intensity of different groups of LEDs using a number of driver channels that is less than the number of LED colors.

Figure 1:
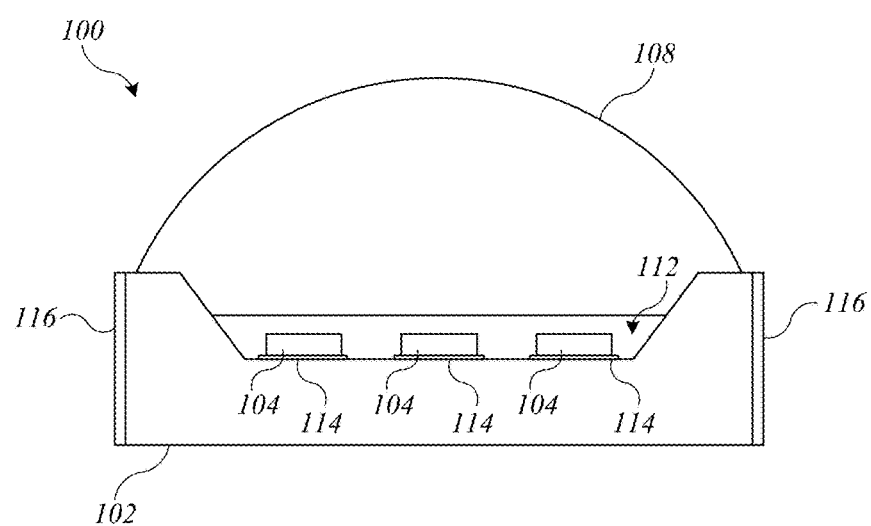
FIG. 1 is a simplified cross-sectional side view of an emitter package according to an embodiment of the present invention.

FIG. 1 is a simplified cross-sectional side view of an emitter package 100 according to an embodiment of the present invention.

Emitter package 100 can include a single ceramic substrate 102, LED chips 104, and a primary lens 108. LED chips 104 can be light-emitting diodes that each generate light of a particular frequency, and each LED chip 104 can be a bare-die semiconductor device. In some embodiments, some or all of LED chips 104 can be coated with a wavelength-shifting material (e.g., a phosphor-containing material). Any type, color, or combination of LED chips can be used. In some embodiments, five or more different types of LED chips 104 are used; specific examples are described below. In some embodiments, none of LED chips 104 are required to produce light along a blackbody locus in a color space (e.g., CIE color space). Instead, blackbody-like white light can be produced by mixing light from the various types of LED chips 104.

Substrate 102 can be a single-layer or multi-layer ceramic substrate. In some embodiments, substrate 102 is formed from multiple layers of a ceramic material (e.g., alumina) that are patterned with metal traces (not shown), then fused together. Vias can be formed to connect metal traces at different layers. The metal traces can provide electrical connection paths from LED chips 104 to peripheral contact pads 116, which may be disposed on the side, top, and/or bottom surfaces of substrate 102. In some embodiments, the metal traces are arranged to provide separate electrical connections to different ones of LED chips 104, thereby allowing different operating currents to be supplied to different LED chips 104 or to different groups of LED chips 104. This is also referred to as independent addressability. By changing the relative operating currents supplied to different groups, it is possible to change the color of light emitted from emitter package 100. In some embodiments of the present invention, each independently addressable group may include LED chips of one or more types (or colors), and at least one of the groups includes LED chips of two or more types. Thus, the number of LED chip types (or colors) may exceed the number of independently addressable groups.

In some embodiments, LED chips 104 are disposed within a circular recess region 112 on the top surface of substrate 102. The top surface of substrate 102 within recess region 112 can be patterned with metal contact pads 114 to provide electrical connections to LED chips 104. In some embodiments, LED chips 104 can have wire-bonding contacts (not shown) on the top surface and can be electrically connected to contact pads 114 by wire bonding. In some embodiments, one or more electrical contacts for LED chips 104 may be on the bottom surfaces of LED chips 104, allowing each LED chip 104 to be electrically connected to the contact pad(s) 114 on which it is placed (e.g., using flip-chip bonding techniques known in the art). The number and arrangement of metal contact pads 114 and LED chips 104 can be varied as desired.

In some embodiments, substrate 102 can be similar to substrates described in U.S. Patent Application Publication No. 2010/0259930. Other types of substrates can also be used. The dimensions of substrate 102 can be varied as desired, e.g., depending in part on the number and arrangement of LED chips 104. For example, substrate 102 can be square with dimensions of 0.7-5.0 cm on a side (e.g., 0.9 cm in one embodiment) and a thickness of 0.5-2.0 mm (e.g., 1.0 mm in one embodiment). In various embodiments, substrates as described herein can accommodate different numbers of LED chips, e.g., 7, 9, 12, 16, or 25 LED chips.

Primary lens 108 can be used to focus or direct light generated by LED chips 104. In some embodiments, the lower portion of lens 108 is shaped to fit into and partially fill recess region 112 as shown in FIG. 1. The remainder of recess region 112 can be filled with air or with an optically transparent material, e.g., approximately matching an index of refraction of lens 108. This material can also act as a sealant or encapsulant that seals primary lens 108 to substrate 102 at the periphery of recess region 112, forming an emitter package that protects LED chips 104 from the elements. In some embodiments, the encapsulant material can also facilitate color mixing for the light from different LED chips 104. For example, the encapsulant can include two or more silicone materials mixed with titanium dioxide $TiO_2$ nanoparticles. In some embodiments, the encapsulant may completely fill recess region 112, and primary lens 108 is not required.

In some embodiments, one or more secondary lenses (not shown), such as a total internal reflection lens, can be used to further shape the light output from emitter 102. In some embodiments, primary lens 108 and/or a secondary lens may facilitate or enhance color mixing of the light produced by LED chips 104 and the encapsulant material. The shape of primary lens 108 can be varied as desired. For example, primary lens 108 may be shaped as a color mixing rod (e.g., a cylindrical shape) or a flat covering for emitter package 100. In some embodiments, primary lens 108 may be omitted, and recess region 112 may be filled with encapsulant material to protect LED chips 104 from the elements.

Figure 2:
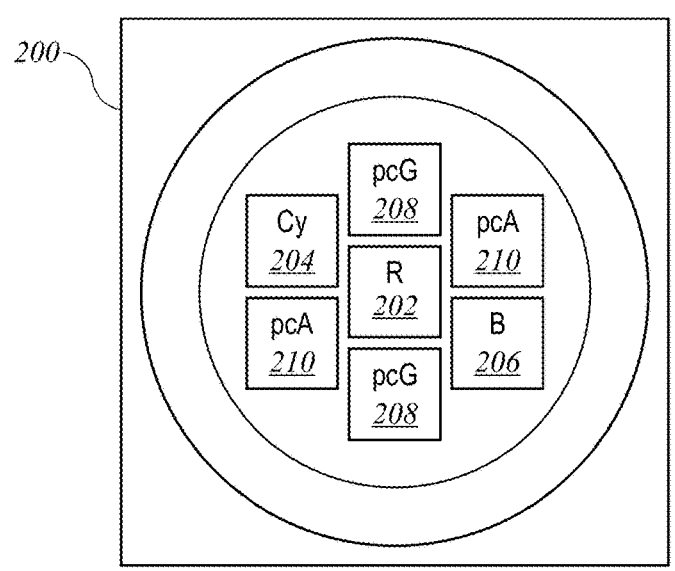
FIG. 2 is a simplified top view of an emitter according to an embodiment of the present invention.

FIG. 2 is a simplified top view of an emitter 200 according to an embodiment of the present invention. Emitter 200 can be a specific implementation of emitter 100 of FIG. 1. Emitter 200 includes seven LED chips having five different colors. (The "color" of an LED chip refers to the color of light it produces, including the effect of any phosphor coating that may be applied to the chip.) Red (R) LED chip 202 may be a monochromatic LED chip with a peak wavelength of around 625 nm. Cyan (Cy) LED chip 204 may be a monochromatic LED chip with a peak wavelength of around 500 nm. Blue (B) LED chip 206 may be a monochromatic LED chip with a peak wavelength of around 450 nm. Green (pcG) LED chips 208 may be made using blue LED chips to which a phosphor coating (e.g., YAG phosphor) has been applied such that the coated LED chip produces broad-spectrum light with a peak wavelength around 500 nm and a full width at half maximum intensity (FWHM) of at least 100 nm. Depending on the particular phosphor mixture and LEDs used, green LED chips 208 may produce green (e.g., lime), greenish-white, or whitish-green light. Amber (pcA) LED chips 210 may be phosphor-converted amber LED chips that produce broad-spectrum light with a peak wavelength around 620 nm and FWHM of at least 100 nm. Phosphors for green LED chips 208 and amber LED chips 210 may include, e.g., conventional yttrium aluminum garnet (YAG) phosphors, GAL (aluminate) phosphor compounds available from Intematix Corporation of Fremont, Calif., and/or other known wavelength-shifting materials.

Figure 3:
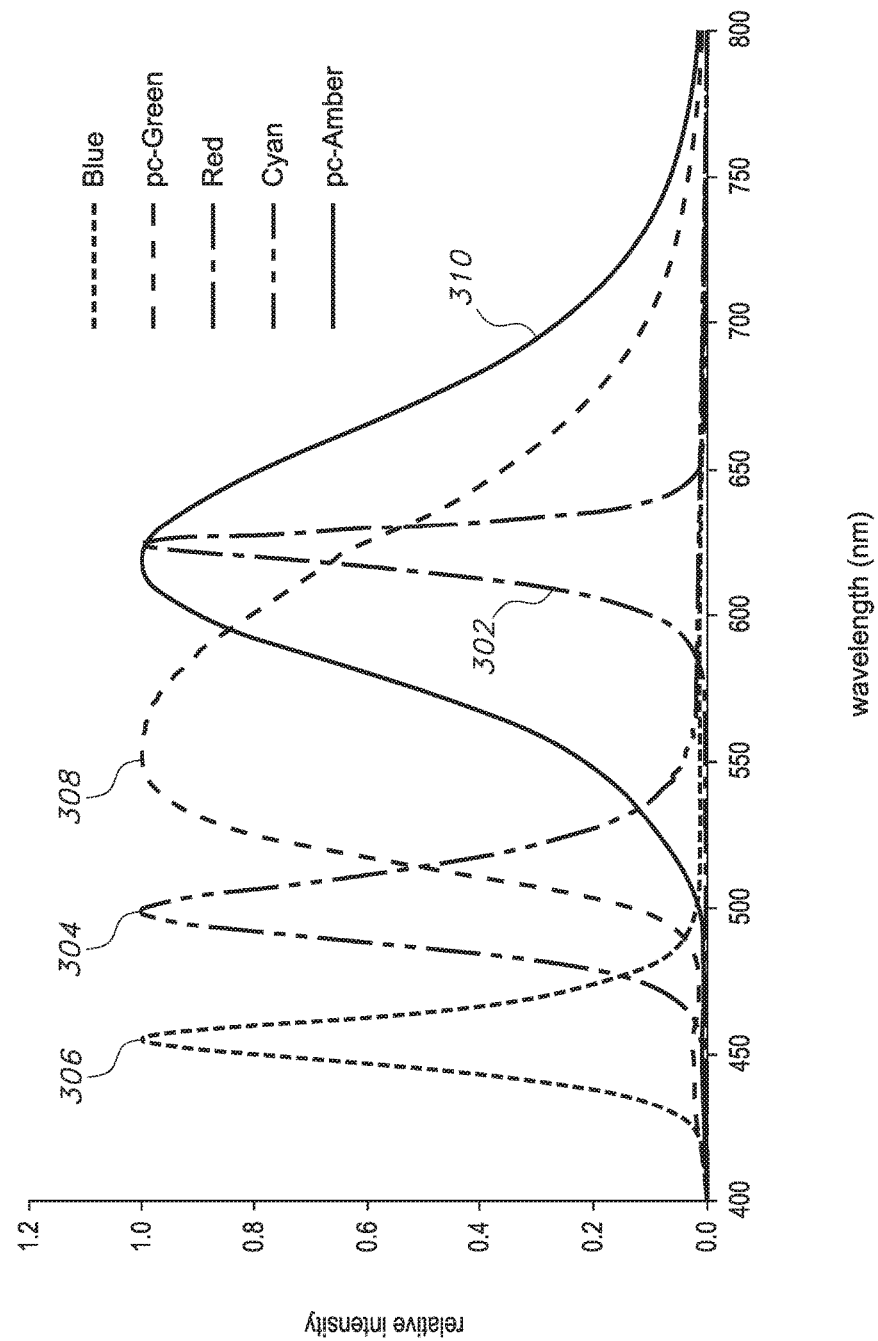
FIG. 3 is a graph illustrating representative spectral characteristics of LEDs that may be used in some embodiments of the present invention.

FIG. 3 is a graph illustrating representative spectral characteristics of LEDs 202-210 according to an embodiment of the present invention. For each LED, the relative intensity (normalized to 1.0 at peak) is plotted as a function of wavelength (in nanometers). Blue line 306 corresponds to blue LED chip 206; cyan line 304 corresponds to cyan LED chip 204; pc-Green line 308 corresponds to green LED chip 208; pc-Amber line 310 corresponds to amber LED chip 210; and red line 302 corresponds to red LED chip 202. As FIG. 3 suggests, a combination of light from these five LED chip types may provide a spectrum with fewer gaps than existing LED lighting devices; however, it should be understood that other LED chip types may be substituted.

Figure 4:
FIG. 4 shows a table 400 listing additional properties for various LEDs that may be used in some embodiments of the present invention.

FIG. 4 shows a table 400 listing additional properties for various LED chip types that may be used in some embodiments of the present invention. For each type (blue, cyan, green, amber, and red), table 400 lists a peak wavelength, CCT, Planck distance (i.e., distance in CIE color space to a nearest point on the blackbody locus), CRI, the R9 component of CRI, and efficiency (lumens per watt). It is to be understood that these properties are illustrative and may be varied.

To provide light of a specific desired color, e.g., white light at a particular CCT, it may be desirable to control the relative intensities of different LEDs 202-210. Individually controlling each LED, however, may be undesirable for various reasons, such as the need for a separate driver channel to provide operating current to each LED. Further, the problem of tuning the light to a desired color (or CCT) may become more complex with an increase in the number of separate channels.

Figure 5:
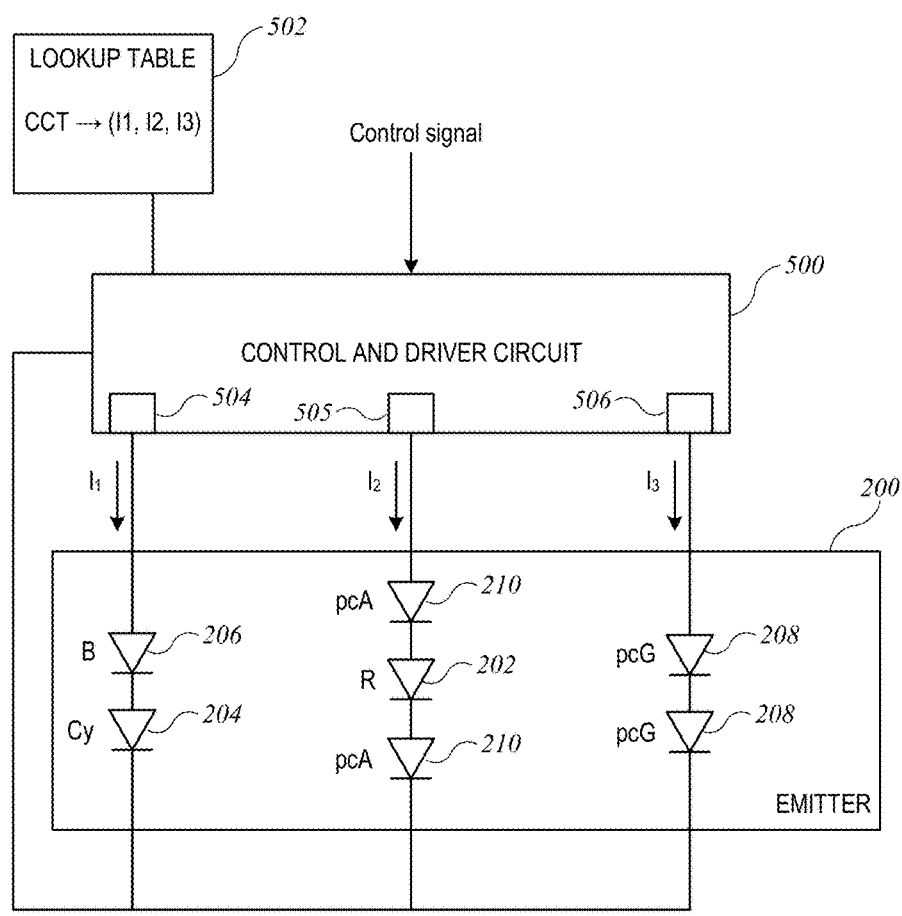
FIG. 5 shows a simplified schematic of control circuitry for an LED emitter according to an embodiment of the present invention.

Accordingly, in some embodiments of the present invention, the intensity of the LEDs is controlled using a number of driver channels that is less than the number of colors of LED chips in the emitter. For instance, LED chips of five (or more) colors may be controlled using three driver channels. FIG. 5 shows a simplified schematic of control circuitry for an LED emitter according to an embodiment of the present invention. As shown, a control and driver circuit 500 can receive an input control signal (e.g., indicating a desired CCT and/or brightness for emitter 100). Based on the control signal, control and driver circuit 500 can produce an output current on each of channels 504, 505, 506. For instance, in some embodiments, control and driver circuit 500 may access a lookup table 502 that maps a desired CCT to a corresponding set of output currents. In some embodiments, driver circuit 500 may also include logic to compute the output currents, e.g., using the desired CCT, lookup table 502, and the desired brightness. The current supplied on each channel 504, 505, 506 can be varied independently, and pulse width modulation or other techniques can be used to produce the desired output currents. Each current can be delivered to a different electrical contact 116 of emitter substrate 102 shown in FIG. 1.

As FIG. 5 shows, the LED chips of emitter 200 can be electrically connected into independently addressable groups, with each group receiving an operating current from a different one of channels 504, 505, 506. Connections may be established, e.g., using the electrical paths on and/or within the emitter substrate, The LED chips in a single group can be heterogeneous (i.e., different colors). For example, a first group connected to channel 504 may include blue LED chip 206 and cyan LED chip 204. A second group connected to channel 505 may include red LED chip 202 and amber LED chips 210. A third group connected to channel 506 may include green LED chips 208. As described above, these connections can be implemented using metal contact pads 114 connected to metal traces between the layers of ceramic substrate 102 of FIGS. 1A and 1B to establish electrical paths between different groups of LED chips and different ones of peripheral contacts 116. The LED chips in each group may be serially connected as shown in FIG. 5.

It will be appreciated that the emitter configuration described herein is illustrative and that variations and modifications are possible. Any number of LED chips and any number of independently-addressable groups of LED chips can be disposed on a single ceramic substrate and incorporated into an emitter package. Further, while control and driver circuit 500 is shown as being external to emitter 100, in some embodiments a control and driver circuit can be incorporated into the emitter package, e.g., by connecting a semiconductor device implementing control and driver circuit 500 to appropriate electrical contacts provided in recess region 112 of emitter 100. Lookup table 502 can be implemented in the same integrated circuit as control and driver circuit 500 or in a separate integrated circuit communicably coupled to control and driver circuit 500. A particular control and driver circuit is not required, and emitters as described herein can be driven by any number of different circuits.

An emitter with LED chips configured as shown in FIGS. 2 and 5 may be used to produce light that approximates blackbody light. Further, by adjusting the relative currents supplied to different groups of LED chips, the CCT of the light may be tuned across a range of the blackbody spectrum.

FIGS. 6A-6D show representative spectral intensity distributions produced by an emitter with LED chips configured as shown in FIG. 5, when tuned to different CCT. FIG.

Figure 6A:
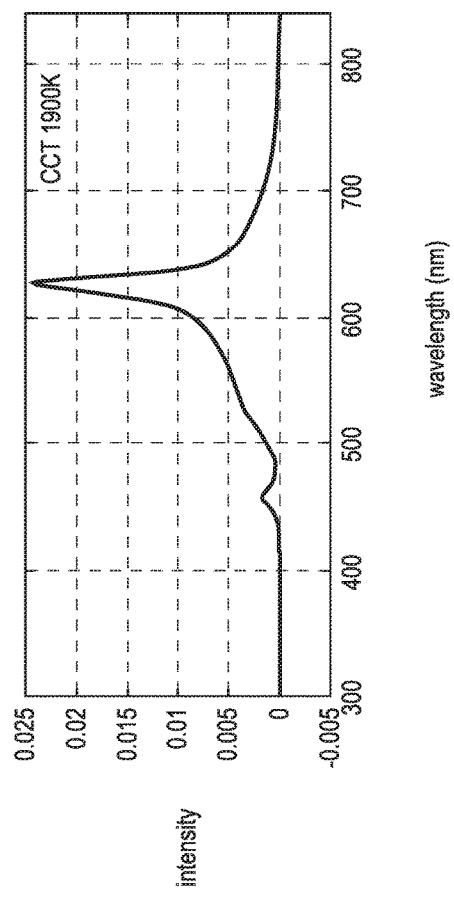
FIGS. 6A-6D show representative spectral intensity distributions produced by a test source at different CCT according to an embodiment of the present invention.
Figure 6B:
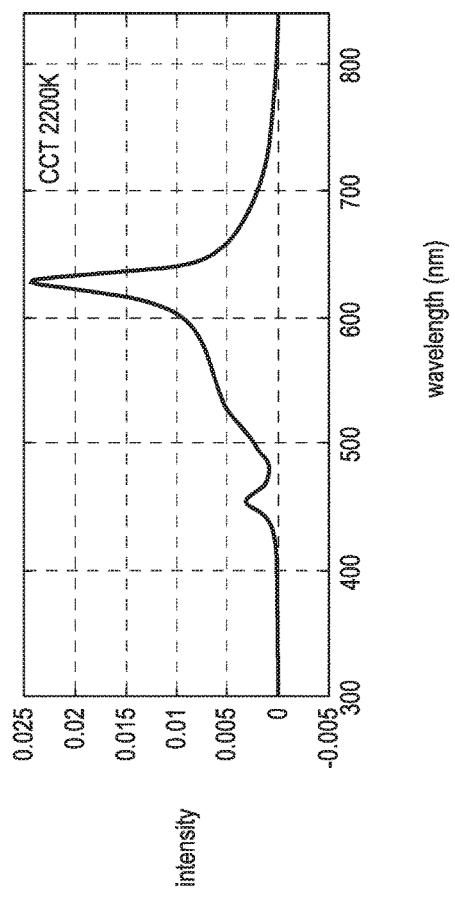
Figure 6C:
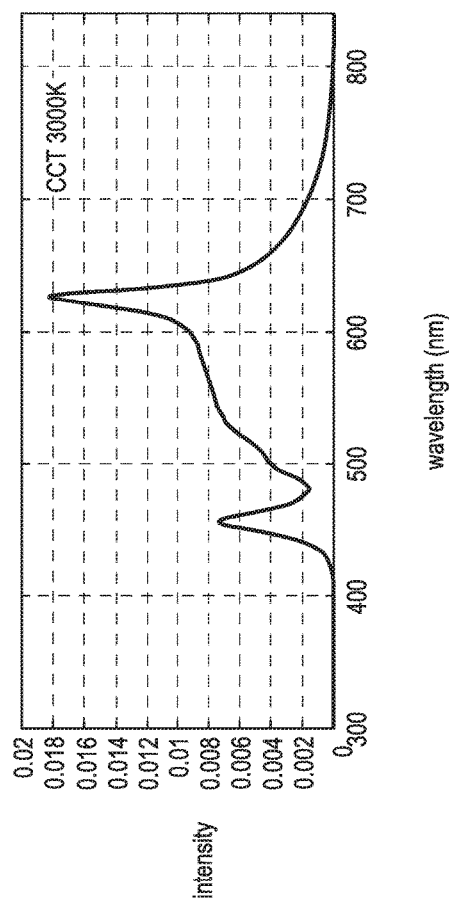
Figure 6D:
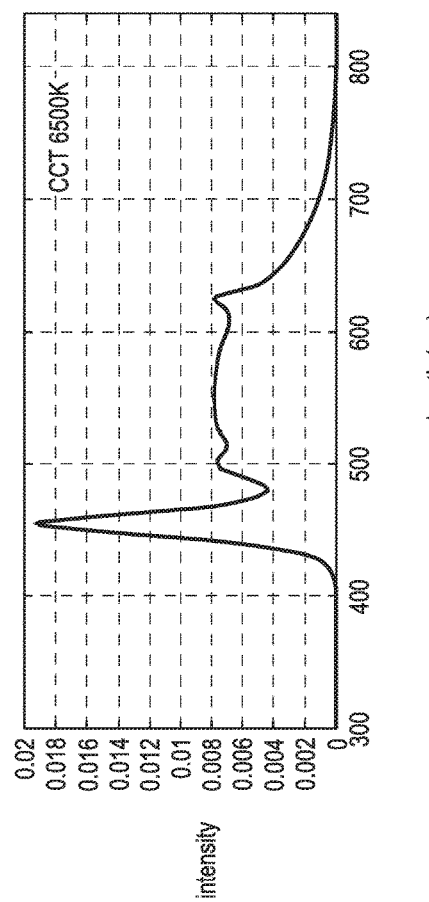

6A shows a spectrum at CCT of about 1900 K. FIG. 6B shows a spectrum at CCT of about 2200 K. FIG. 6C shows a spectrum at CCT of about 3000 K. FIG. 6D shows a spectrum at CCT of about 6500 K. The different CCT can be achieved by adjusting the relative currents supplied to the three groups of LEDs, e.g., using control and driver circuit 500 of FIG. 5. As can be seen, a continuous spectrum is produced, although peaks persist (notably at the blue and red LED wavelengths).

Figure 7A:
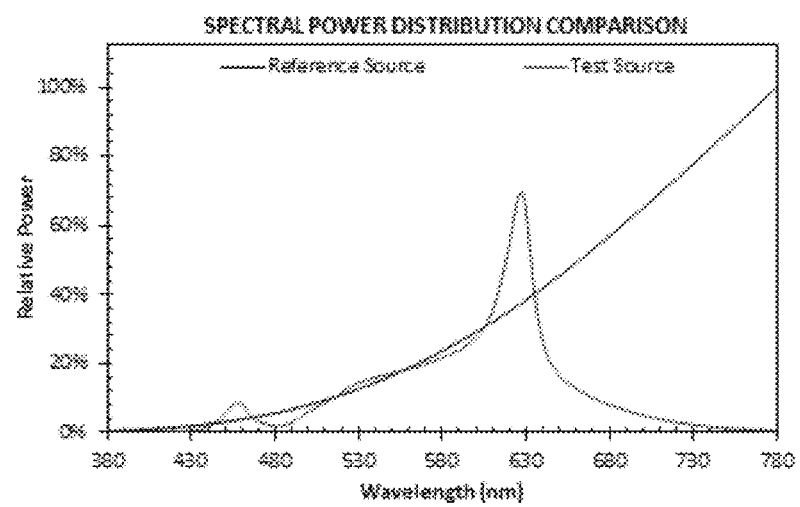
FIGS. 7A-7C show color quality measurements of light produced by a test source at CCT of about 2200 K according to an embodiment of the present invention.
Figures 7B, 7C:
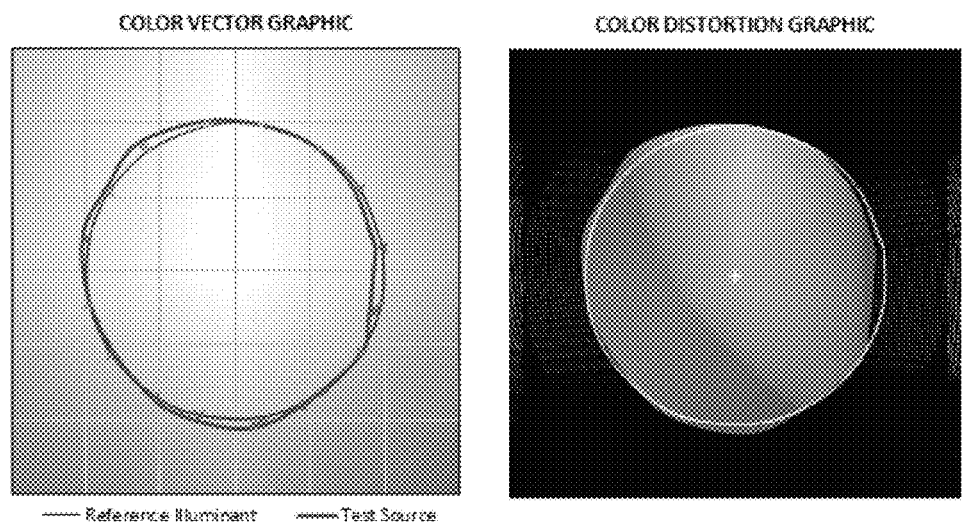

A further understanding of the quality of light can be had using color quality measurement techniques described in TM-30-15. FIGS. 7A-7C show additional color quality measurements at CCT of about 2200 K for an emitter with LED chips configured as shown in FIG. 5. Specifically, FIG. 7A shows a spectral power distribution comparison between the test source (an LED emitter configured as shown in FIG. 5) and a reference source (an ideal blackbody radiator at a temperature of 2200 K). Over most of the visible spectrum (about 390 nm to about 700 nm), the spectrum matches fairly well.

FIGS. 7B and 7C show a color vector graphic and a color distortion graphic generated following the methodology of TM-30-15. These graphics allows comparison of saturation levels between the test source and the reference source. In FIG. 7B, the circle indicates a "reference" saturation level for the reference source illuminating objects of various colors; the red line indicates relative saturation levels for the test source, determined by measuring saturation of objects of different reference colors (marked by X) and connecting the measurement points. Outward deviation from the reference level indicates oversaturation; inward deviation indicates undersaturation. The plot in FIG. 7C is based on the same data, with the area outside the curve defined for the test source masked to black. In this example, saturation deviations are small: slight oversaturation for green and blue, slight undersaturation for red.

Figure 8A:
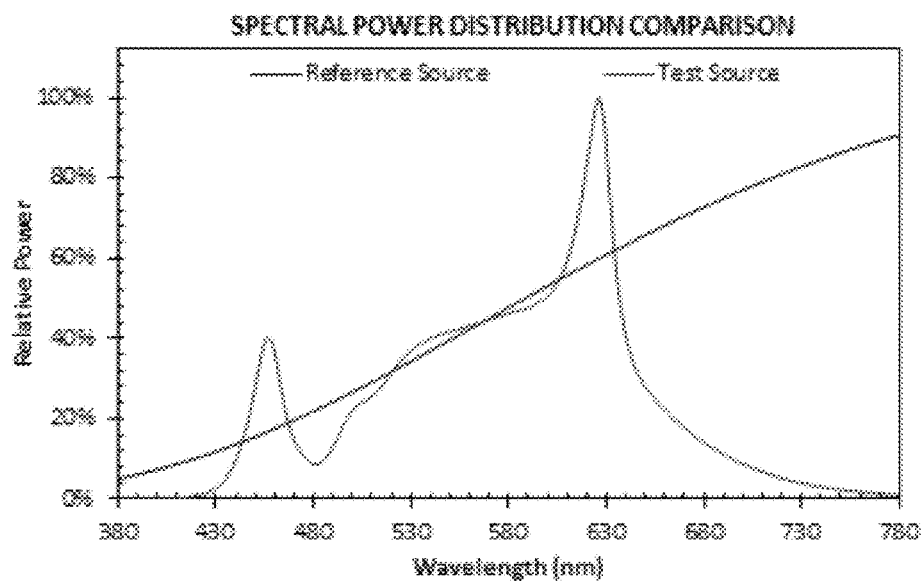
FIGS. 8A-8C show color quality measurements of light produced by a test source at CCT of about 3000 K according to an embodiment of the present invention.
Figure 8B:
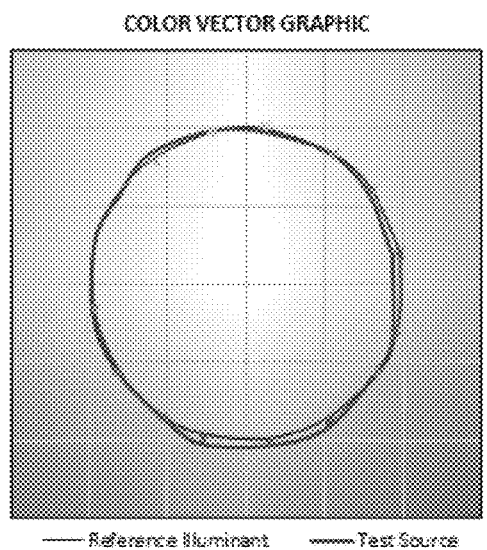
Figure 8C:
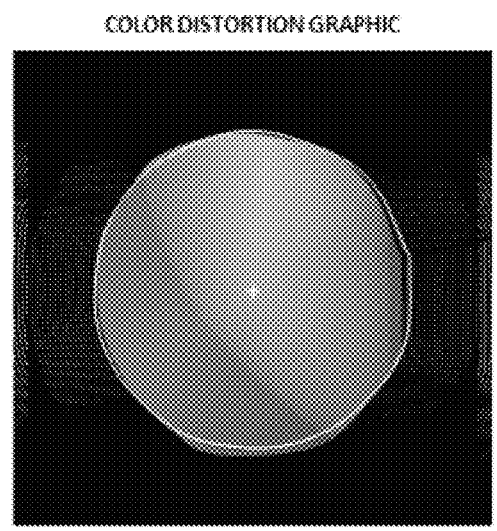

FIGS. 8A-8C show color quality measurements corresponding to those of FIGS. 7A-7C, but at a CCT of 3000 K. In this example, the deviations from the reference source are again small: slight oversaturation for blue, slight undersaturation for red.

Figure 9A:
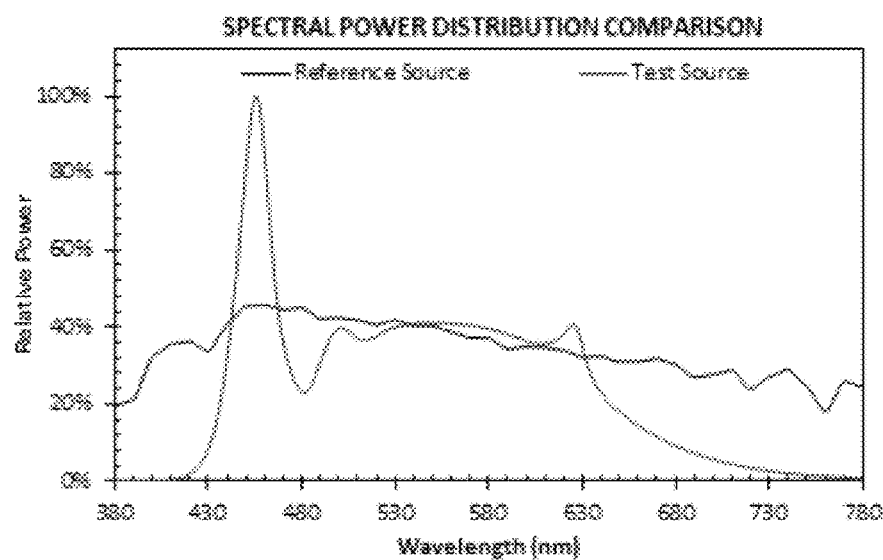
FIGS. 9A-9C show color quality measurements of light produced by a test source at CCT of about 6500 K according to an embodiment of the present invention.
Figure 9B:
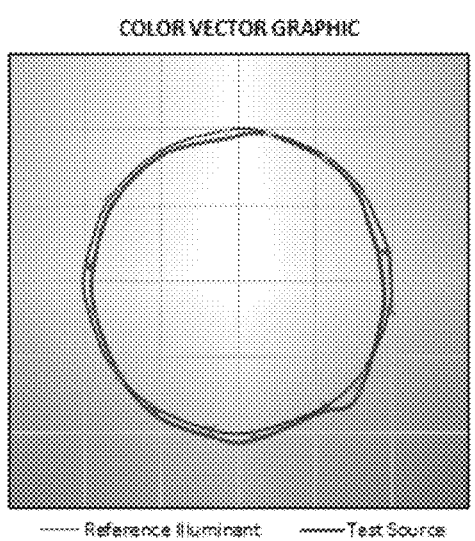
Figure 9C:
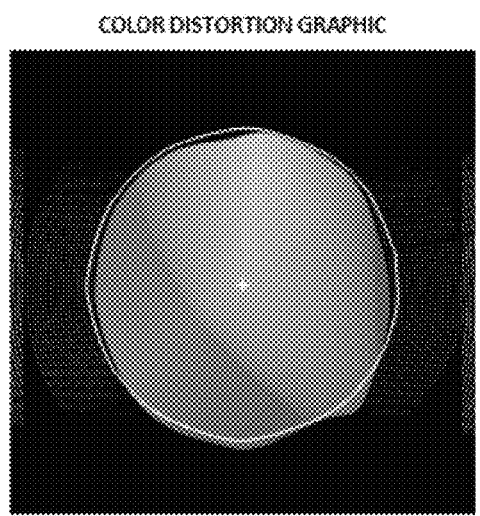

FIGS. 9A-9C show color quality measurements corresponding to those of FIGS. 7A-7C, but at a CCT of 6500 K. In this example, small deviations from the reference source are again observed. Taken together, FIGS. 7A-7C, 8A-8C, and 9A-9C indicate high quality light across the range of CCT from 2200 K to 6500 K, a region of considerable interest for environmental lighting applications.

FIG. 10 shows a table 1000 summarizing color quality measurement for the test source at CCT of 2200 K, 3000 K, and 6500 K. Shown are the measured Rf and Rg (as defined by TM-30-15); Duv (distance in CIE color space to the nearest point on the blackbody locus); CIE x and y color coordinates; CIE $R_a$, CRI (similar to CIE $R_a$); and CRI09-CRI. Also shown are the following energy-related parameters: luminous flux (in lumens), power (in watts), and efficiency (lumens per watt).

As these examples show, an LED emitter using five colors of LEDs and three control channels can provide a high-quality white light that is tunable across a range of the blackbody locus. Use of fewer driver channels than the number of LED colors may simplify the tuning process by reducing the number of independent variables. In some embodiments, a testing process during device manufacture may be used to determine suitable combinations of driver currents for each channel (or group of LEDs) to achieve various color settings (e.g., various CCT), and a lookup table (e.g., lookup table 502 of FIG. 5) mapping a particular color setting to a combination of driver currents may be stored in memory (either on the emitter or in a lighting device in which the emitter is incorporated). Thereafter, during operation of the emitter, a control signal may indicate the desired color setting, and control and driver circuit 500 may read lookup table 502 to determine the appropriate driver currents for each channel.

Embodiments of the invention are not limited to the particular configuration of LED chips described above. Other combinations may also be used.

Figure 11:
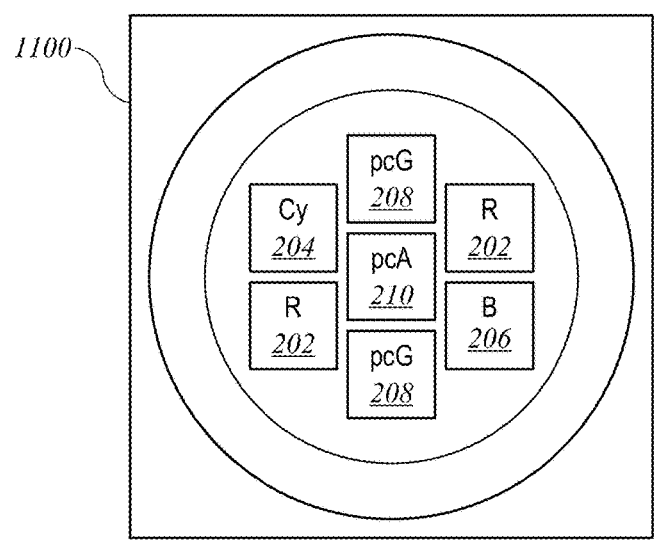
FIG. 11 shows a simplified top view of an emitter with seven LED chips according to another embodiment of the present invention.

For example, FIG. 11 shows a simplified top view of an emitter 1100 with seven LED chips according to another embodiment of the present invention. In this example, instead of two amber LED chips 210 and one red LED chip 202, emitter 1100 includes one amber LED chip 210 and two red LED chips 202. The LED chips may be connected into independently addressable groups similarly to FIG. 5, with a first group including blue LED chip 206 and cyan LED chip 204, a second group including both red LED chips 202 and amber LED chip 210, and a third group including green LED chips 208. In some embodiments, this may improve the color rendering quality, particularly for red objects.

Figure 12:
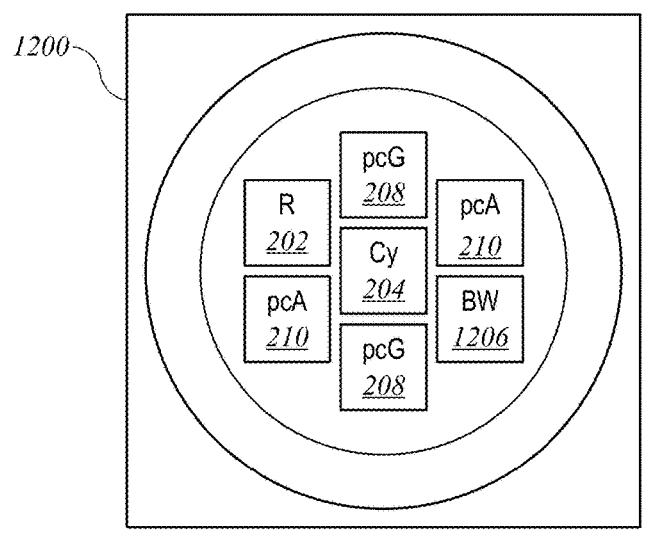
FIG. 12 shows a simplified top view of an emitter with seven LED chips according to another embodiment of the present invention.

Further, LEDs of different colors may be substituted. For example, FIG. 12 shows a simplified top view of an emitter 1200 with seven LED chips according to another embodiment of the present invention. In this example, blue LED chip 206 of emitter 100 is replaced with bluish white LED chip 1206. Bluish white LED chip 1206 can be a phosphor-coated blue LED chip that emits light with a peak wavelength still in the blue range but with a wider spectrum than blue LED chip 206; for example, YAG 555 nm or GAL 525 nm phosphor materials maybe used. The LED chips may be connected into independently addressable groups similarly to FIG. 5, with a first group including bluish white LED chip 1206 and cyan LED chip 204, a second group including red LED chip 202 and amber LED chips 210, and a third group including green LED chips 208. In some embodiments, this substitution may allow operation at higher luminous flux while still producing white light. It may also contribute to color quality, e.g., by partially smoothing out the blue peak in the combined spectrum, particularly in the spectra of FIGS. 6C and 6D.

Figure 13:
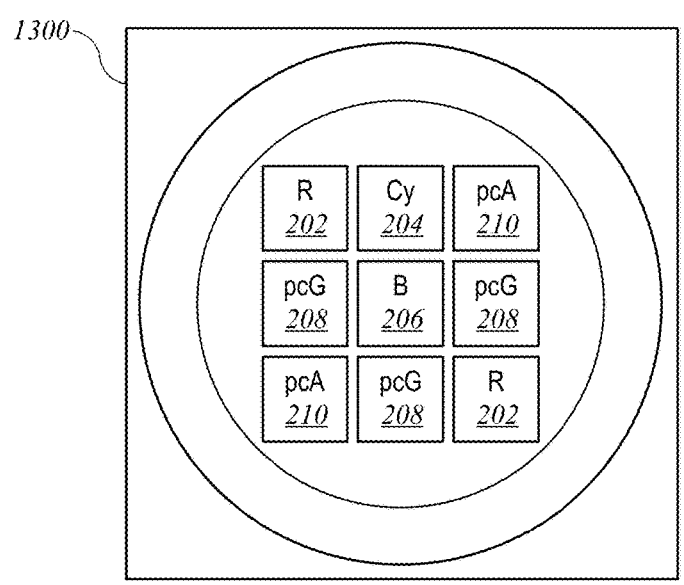
FIG. 13 shows a simplified top view of an emitter with nine LED chips according to another embodiment of the present invention.

In addition, the number of LEDs may also be varied. FIG. 13 shows a simplified top view of an emitter 1300 with nine LED chips according to another embodiment of the present invention. Emitter 1300 includes two red LED chips 202, one cyan LED chip 204, one blue LED chip 206, three green LED chips 208, and two amber LED chips 210. The LED chips may be connected into independently addressable groups similarly to FIG. 5, with a first group including blue LED chip 206 and cyan LED chip 204, a second group including red LED chips 202 and amber LED chips 210, and a third group including green LED chips 208.

Figure 14:
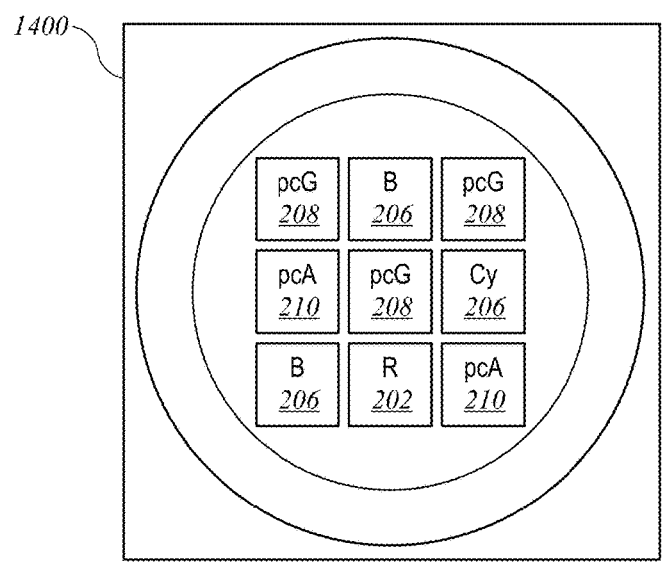
FIG. 14 shows a simplified top view of an emitter with nine LED chips according to another embodiment of the present invention.

FIG. 14 shows a simplified top view of an emitter 1400 with nine LED chips according to another embodiment of the present invention. Emitter 1400 includes one red LED chip 202, one cyan LED chip 204, two blue LED chips 206, three green LED chips 208, and two amber LED chips 210. The LED chips may be connected into independently addressable groups similarly to FIG. 5, with a first group including blue LED chip 206 and cyan LED chip 204, a second group including red LED chip 202 and amber LED chips 210, and a third group including green LED chips 208.

Figure 15:
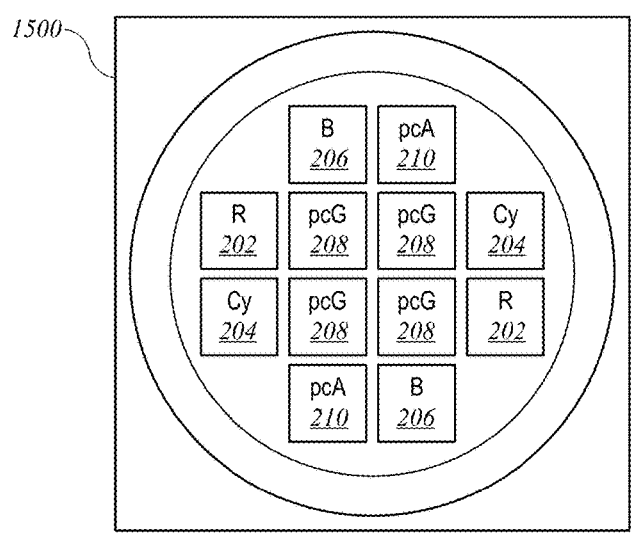
FIG. 15 shows a simplified top view of an emitter with twelve LED chips according to another embodiment of the present invention.

FIG. 15 shows a simplified top view of an emitter 1500 with twelve LED chips according to another embodiment of the present invention. Emitter 1500 includes two red LED chips 202, two cyan LED chips 204, two blue LED chips 206, four green LED chips 208, and two amber LED chips 210. The LED chips may be connected into independently addressable groups similarly to FIG. 5, with a first group including blue LED chips 206 and cyan LED chips 204, a second group including red LED chips 202 and amber LED chips 210, and a third group including green LED chips 208.

Figure 16:
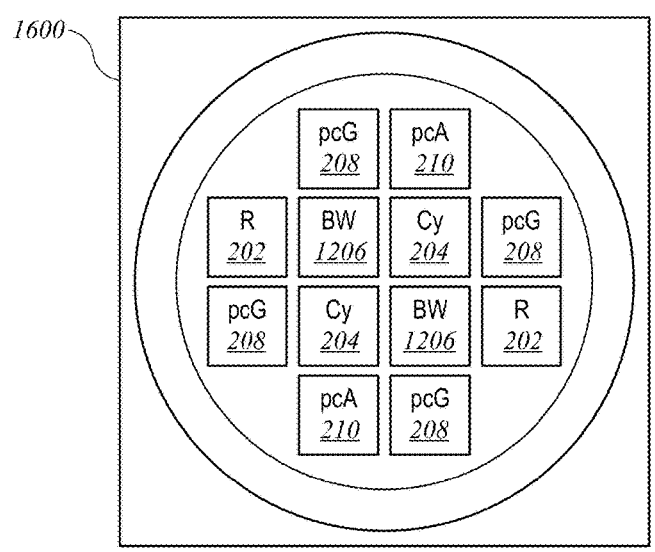
FIG. 16 shows a simplified top view of an emitter with twelve LED chips according to another embodiment of the present invention.

FIG. 16 shows a simplified top view of an emitter 1600 with twelve LED chips according to another embodiment of the present invention. Emitter 1600 includes two red LED chips 202, two cyan LED chips 204, two bluish white LED chips 1206, four green LED chips 208, and two amber LED chips 210. The LED chips may be connected into independently addressable groups similarly to FIG. 5, with a first group including bluish white LED chips 1206 and cyan LED chips 204, a second group including red LED chips 202 and amber LED chips 210, and a third group including green LED chips 208.

Figure 17:
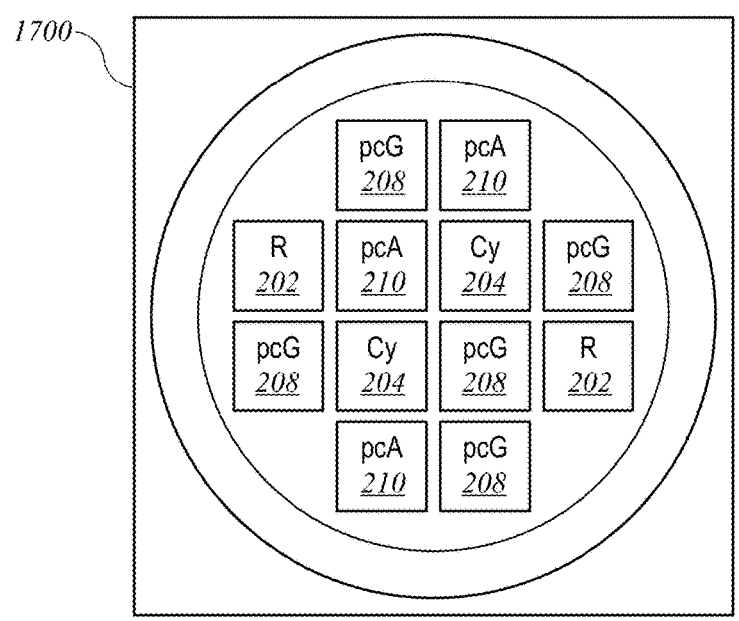
FIG. 17 shows a simplified top view of an emitter with twelve LED chips according to another embodiment of the present invention.

FIG. 17 shows a simplified top view of an emitter 1700 with twelve LED chips according to another embodiment of the present invention. Emitter 1700 includes two red LED chips 202, two cyan LED chips 204, five green LED chips 208, and three amber LED chips 210. The LED chips may be connected into independently addressable groups similarly to FIG. 5, with a first group including cyan LED chips 204, a second group including red LED chips 202 and amber LED chips 210, and a third group including green LED chips 208. In this example, a blue LED chip is not used; however, green LED chips 208 may be based on a narrow-band blue LED (with phosphor coating) and accordingly may provide some illumination at the blue end of the visible spectrum.

Figure 18:
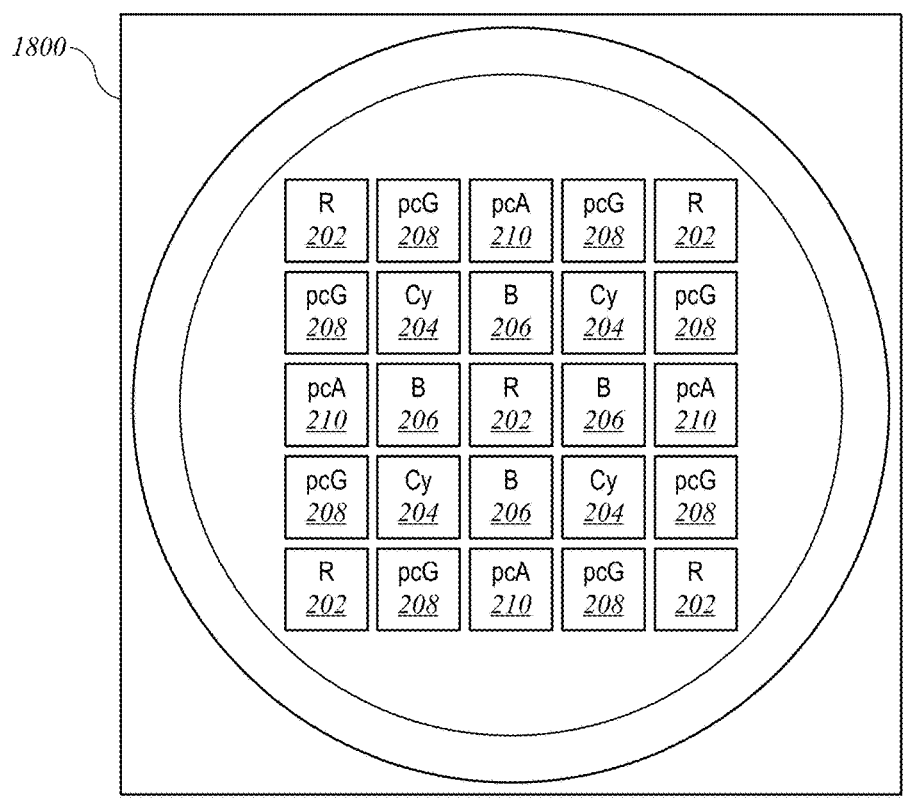
FIG. 18 shows a simplified top view of an emitter with twenty-five LED chips including five colors according to another embodiment of the present invention.

FIG. 18 shows a simplified top view of an emitter 1800 with twenty-five LED chips including five colors according to another embodiment of the present invention. Emitter 1800 includes five red LED chips 202, four cyan LED chips 204, four blue LED chips 206, eight green LED chips 208 (which may produce greenish-white light as described above), and four amber LED chips 210. The LED chips may be connected into independently addressable groups similarly to FIG. 5, with a first group including cyan LED chips 204 and blue LED chips 206, a second group including red LED chips 202 and amber LED chips 210, and a third group including green LED chips 208.

Figure 19:
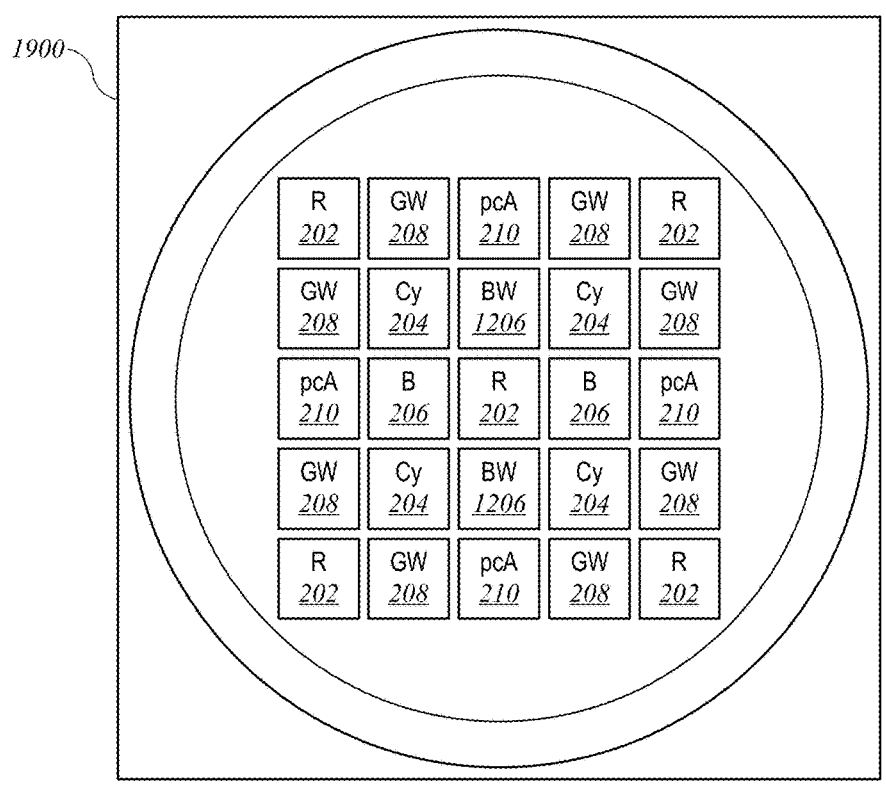
FIG. 19 shows a simplified top view of an emitter with twenty-five LED chips including six colors according to another embodiment of the present invention.

FIG. 19 shows a simplified top view of an emitter 1800 with twenty-five LED chips including six colors according to another embodiment of the present invention. Emitter 1900 includes five red LED chips 202, four cyan LED chips 204, two blue LED chips 206, two bluish-white LED chips 1206, eight green LED chips 208 (which may produce greenish-white light as described above), and four amber LED chips 210. The LED chips may be connected into independently addressable groups similarly to FIG. 5, with a first group including cyan LED chips 204, blue LED chips 206, and bluish white LED chips 1208; a second group including red LED chips 202 and amber LED chips 210; and a third group including green LED chips 208. In this example, one group may include LED chips of three different colors.

Figure 20:
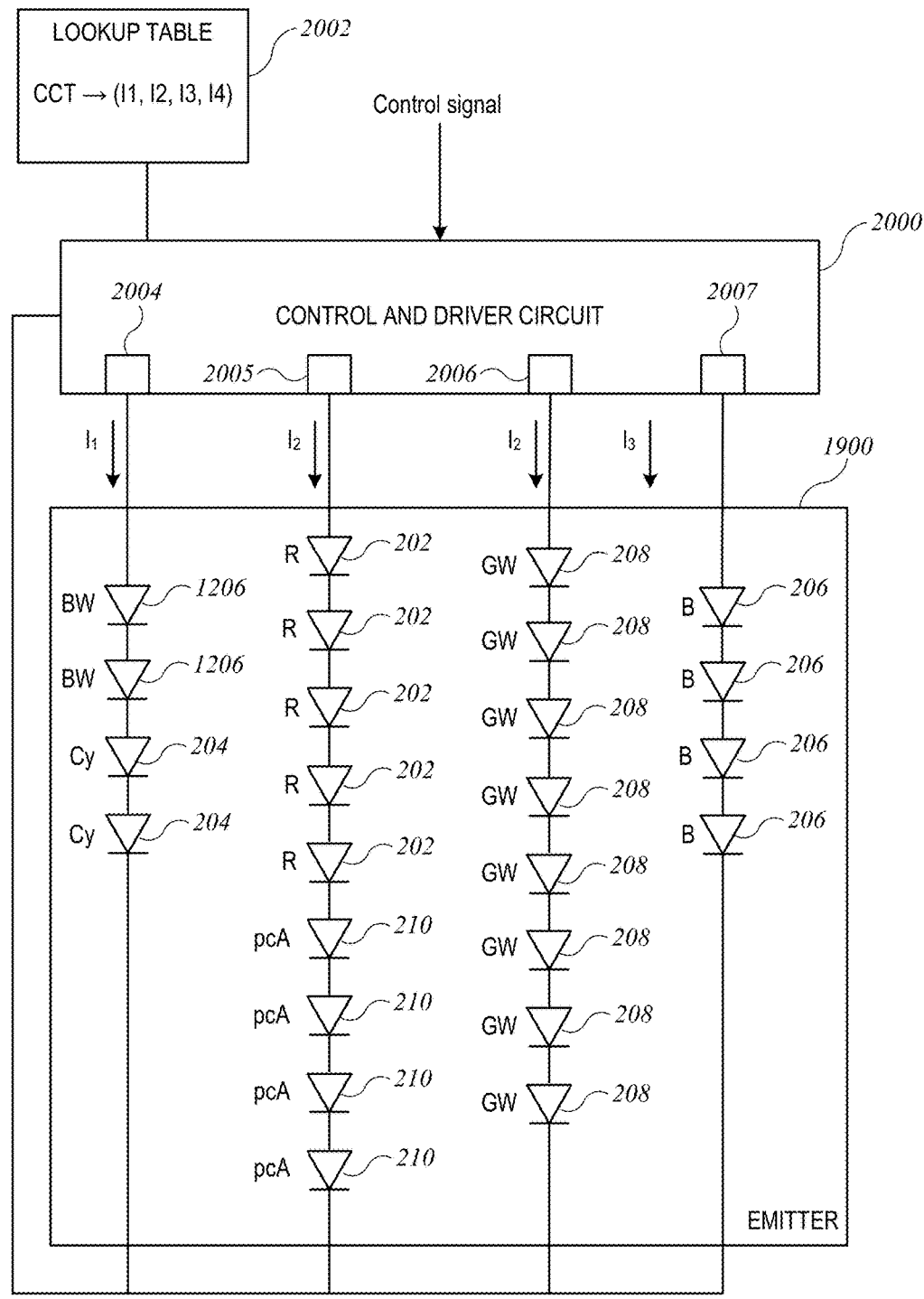
FIG. 20 shows a simplified schematic of control circuitry for an LED emitter according to another embodiment of the present invention.

In other embodiments, more than three independently addressable groups may be provided. FIG. 20 shows a simplified schematic of control circuitry for LED emitter 1900 according to another embodiment of the present invention. As shown, a control and driver circuit 2000 can receive an input control signal (e.g., indicating a desired CCT and/or brightness for emitter 1900). Based on the control signal, control and driver circuit 500 can produce an output current on each of four channels 2004, 2005, 2006, 2007. For instance, in some embodiments, control and driver circuit 2000 may access a lookup table 2002 that maps a desired CCT to a corresponding set of output currents. In some embodiments, control and driver circuit 2000 may also include logic to compute the output currents, e.g., using the desired CCT, lookup table 1002, and the desired brightness. The current supplied on each channel 2004, 2005, 2006 can be varied independently, and pulse width modulation or other techniques can be used to produce the desired output currents. Each current can be delivered to a different electrical contact of the emitter substrate (similarly to emitter substrate 102 shown in FIG. 1).

As FIG. 20 shows, the LED chips of emitter 1900 can be electrically connected into four independently addressable groups, with each group receiving an operating current from a different one of channels 2004, 2005, 2006, 2007. Connections may be established, e.g., using the electrical paths on and/or within the emitter substrate, The LED chips in a single group can be heterogeneous (i.e., different colors). For example, a first group connected to channel 2004 may include bluish-white LED chips 206 and cyan LED chips 204. A second group connected to channel 2005 may include red LED chips 202 and amber LED chips 210. A third group connected to channel 2006 may include green LED chips 208. A fourth group connected to channel 2007 may include blue LED chips 206. As described above, these connections can be implemented using metal contact pads 114 connected to metal traces between the layers of ceramic substrate 102 of FIGS. 1A and 1B to establish electrical paths between different groups of LED chips and different ones of peripheral contacts 116. The LED chips in each group may be serially connected as shown in FIG. 20. In this example, the separate control channel for blue LED chips 206 may allow optimization or minimization of the blue spectral peak. It is to be understood that other configurations, including configurations with more than four independently addressable groups may be provided.

While the invention has been described with respect to specific embodiments, one skilled in the art will recognize that numerous modifications are possible. For instance, the total number of LEDs and the number of LEDs of each color may be varied as desired. The number of colors can be five or more and may exceed the number of independently addressable groups of LEDs (or the number of driver channels). Accordingly, at least one of the LED groups may include LEDs of at least two different colors. For instance, in each of the examples above, one of the groups includes red and amber LEDs, and in some of the examples above, one of the groups includes blue (or bluish white) and cyan LEDs. In some embodiments, a group may include LEDs of more than two colors; for instance, a group may include blue, cyan, and bluish white LEDs.

The particular LED chips and colors can be varied. For instance, green LED chips may be implemented using phosphor coatings applied to blue LED chips to provide broad-spectrum light with dominant wavelengths in the green region of the spectrum (about 495 nm to about 570 nm). Depending on the particular phosphor coating, the color of light may be green, whitish green, or greenish white. Similarly, other types of LED chips may be substituted for the particular red, cyan, blue, and amber LED chips described herein. For instance, a blue LED chip may have a peak wavelength between about 420 nm and about 460 nm; a cyan LED chip may have a peak wavelength between about 490 nm and about 520 nm; an amber LED chip may have a peak wavelength between about 590 nm and about 620 nm; and a red LED chip may have a peak wavelength between about 620 nm and about 645 nm.

The number of driver channels may be modified as desired and may be less than or equal to the number of colors of LED chips. As the examples above illustrate, limiting the number of channels to three provides simple control circuitry (and tuning) and good color quality across a large range of the blackbody spectrum; however, additional channels may be used.

It is to be understood that the emitters according to embodiments of the present invention, including any of the example emitters described above, can be dynamically tunable during user operation, to a desired color or CCT within the tuning range. As described above, the electrical connections through the ceramic substrate can be arranged such that each LED group is independently addressable. Accordingly, tuning to a desired color or CCT can be achieved by controlling the relative operating currents supplied to the different LED groups. In some embodiments, an automated system can be used to determine a ratio of currents on different channels that corresponds to a particular color or CCT, and a color-mixing lookup table can be constructed that specifies the relative currents to be used for a given color or CCT. In a manufacturing environment where the color of light produced by a given LED group is reliably consistent from one device to the next, the same lookup table can be applied to all devices manufactured in that environment. Where the color of light is more variable, an automated process and system can be used to determine a lookup table for each emitter, e.g., as part of an emitter manufacturing process. Examples of suitable processes and systems are described in U.S. Patent App. Pub. No. 2012/0286699; other processes and systems can also be used. The lookup table can be provided to a control circuit that generates the currents supplied to the LED, e.g., as described above.

Thus, although the invention has been described with respect to specific embodiments, it will be appreciated that the invention is intended to cover all modifications and equivalents within the scope of the following claims.

What is claimed is:

1. A light-emitting device comprising:
   a substrate;
   a plurality of LED chips disposed on the substrate, the LED chips including LED chips of at least four different colors; and
   a plurality of electrical paths disposed in part on the substrate and in part within the substrate, the electrical paths connecting the LED chips into at least three independently addressable groups, the number of independently addressable groups being less than the number of different colors of the LED chips, wherein each LED chip belongs to only one of the independently addressable groups,
   wherein different ones of the independently addressable groups of LEDs produce different colors of light and wherein at least a first one of the independently addressable groups of LEDs includes a first LED chip of a first color and a second LED chip of a second color different from the first color, wherein the first LED chip is a monochromatic LED chip and the second LED chip is a phosphor-converted LED chip that produces broad spectrum light having a full width at half maximum intensity (FWHM) of at least 100 nm.

2. The light-emitting device of claim 1 wherein a second one of the independently addressable groups includes a phosphor-converted green LED chip that produces broad-spectrum light dominated by green wavelengths.

3. The light-emitting device of claim 1 wherein the first LED chip is a red LED chip and the second LED chip is a phosphor-converted amber LED chip.

4. The light-emitting device of claim 3 wherein a second one of the independently addressable groups includes one or more cyan LED chips.

5. The light-emitting device of claim 4 wherein a third one of the independently addressable groups includes a green LED chip that produce broad-spectrum light dominated by green wavelengths.

6. The light-emitting device of claim 3 wherein a second one of the independently addressable groups includes at least one phosphor-converted bluish white LED chip and at least one cyan LED chip.

7. The light-emitting device of claim 6 wherein a third one of the independently addressable groups includes a phosphor-converted green LED chip that produces broad-spectrum light dominated by green wavelengths.

8. The light-emitting device of claim 1 further comprising:
   a control and driver circuit to provide an operating current to each of the independently addressable groups in response to a control signal.

9. The light-emitting device of claim 8 wherein the control signal includes a signal indicating a desired correlated color temperature (CCT) of output light from the device.

10. The light-emitting device of claim 1 further comprising:
    a primary lens overlying the plurality of LED chips and sealed to the substrate.

11. The light-emitting device of claim 1 wherein the substrate has a recess region and the plurality of LED chips are disposed within the recess region, and wherein the light-emitting device further comprises:
    an encapsulant material disposed at least partially within the recess region.

12. The light-emitting device of claim 11 wherein the encapsulant material comprises two or more silicone materials mixed with titanium dioxide ($TiO_2$) nanoparticles.

13. A light-emitting device comprising:
    a substrate;
    a plurality of LED chips disposed on the substrate, the LED chips including LED chips of at least five different colors; and
    a plurality of electrical paths disposed in part on the substrate and in part within the substrate, the electrical paths connecting the LED chips into exactly three independently addressable groups, wherein each LED chip belongs to only one of the independently addressable groups,
    wherein different ones of the independently addressable groups of LEDs produce different colors of light and wherein at least a first one of the independently addressable groups of LEDs includes a first LED chip of a first color and a second LED chip of a second color different from the first color, wherein the first LED chip is a monochromatic LED chip and the second LED chip is a phosphor-converted LED chip that produces broad-spectrum light having a full width at half maximum intensity (FWHM) of at least 100 nm.

14. The light-emitting device of claim 13 wherein a color of output light from the light-emitting device is tunable by controlling a current supplied to each of the independently addressable groups, wherein the tunable color includes white light with correlated color temperature (CCT) in a range from 2200 K to 6500 K and wherein, at any CCT within the range, the white light has color rendering index (CRI) greater than 90, TM30 Rf greater than 85, and TM30 Rg between 96 and 104.

15. The light-emitting device of claim 13 wherein:
the first one of the independently addressable groups consists of one or more red LED chips and one or more phosphor-converted amber LED chips;
a second one of the independently addressable groups consists of one or more blue LED chips and one or more cyan LED chips; and
a third one of the independently addressable groups consists of one or more phosphor-converted green LED chips.

16. The light-emitting device of claim 13 wherein:
the first one of the independently addressable groups consists of one or more phosphor-converted bluish white LED chips and one or more cyan LED chips;
a second one of the independently addressable groups consists of one or more red LED chips and one or more phosphor-converted amber LED chips; and
a third one of the independently addressable groups consists of one or more phosphor-converted green LED chips that produce broad-spectrum light dominated by green wavelengths.

17. The light-emitting device of claim 13 wherein:
the first one of the independently addressable groups consists of one or more red LED chips and one or more phosphor-converted amber LED chips;
a second one of the independently addressable groups consists of one or more cyan LED chips and one or more blue LED chips; and
a third one of the independently addressable groups consists of one or more phosphor-converted green LED chips that produce broad-spectrum light dominated by green wavelengths.

18. The light-emitting device of claim 13 further comprising:
a control and driver circuit to provide an operating current to each of the independently addressable groups in response to a control signal.

19. The light-emitting device of claim 18 wherein the control signal includes a signal indicating a desired correlated color temperature (CCT) of output light from the device.

20. The light-emitting device of claim 13 further comprising:
a primary lens overlying the plurality of LED chips and sealed to the substrate.

21. The light-emitting device of claim 13 wherein the substrate has a recess region and the plurality of LED chips are disposed within the recess region, and wherein the light-emitting device further comprises:
an encapsulant material disposed at least partially within the recess region.

22. The light-emitting device of claim 21 wherein the encapsulant material comprises two or more silicone materials mixed with titanium dioxide ($TiO_2$) nanoparticles.

23. The light-emitting device of claim 1 wherein a color of output light from the light-emitting device is tunable by controlling a current supplied to each of the independently addressable groups, wherein the tunable color includes white light with correlated color temperature (CCT) in a range from 2200 K to 6500 K and wherein, at any CCT within the range, the white light has color rendering index (CRI) greater than 90, TM30 Rf greater than 85, and TM30 Rg between 96 and 104.

* * * * *